(12) United States Patent
Yamakawa et al.

(10) Patent No.: US 7,786,667 B2
(45) Date of Patent: Aug. 31, 2010

(54) ORGANIC ELECTROLUMINESCENT ELEMENT COMPRISING A LUMINESCENT ASSIST LAYER

(75) Inventors: Hideyuki Yamakawa, Tokyo (JP); Akiko Tsujii, Tokyo (JP); Takao Shishido, Tokyo (JP)

(73) Assignee: Toppan Printing Co., Ltd. (JP)

( * ) Notice: Subject to any disclaimer, the term of this patent is extended or adjusted under 35 U.S.C. 154(b) by 423 days.

(21) Appl. No.: 11/546,621

(22) Filed: Oct. 11, 2006

(65) Prior Publication Data

US 2007/0085472 A1    Apr. 19, 2007

(30) Foreign Application Priority Data

Oct. 19, 2005  (JP)  ............................. 2005-304091

(51) Int. Cl.
*H01L 51/00*   (2006.01)
*H01L 51/50*   (2006.01)
*H01L 51/52*   (2006.01)
*H01L 51/56*   (2006.01)

(52) U.S. Cl. ....................... 313/504; 313/500; 313/503; 313/505; 313/506; 313/509

(58) Field of Classification Search .......... 313/498–512
See application file for complete search history.

(56) References Cited

U.S. PATENT DOCUMENTS

| 5,601,903 | A  | * | 2/1997 | Fujii et al. | 428/212 |
|---|---|---|---|---|---|
| 2002/0028349 | A1 | * | 3/2002 | Seo | 428/690 |
| 2003/0008429 | A1 | * | 1/2003 | Yamazaki et al. | 438/30 |
| 2004/0004431 | A1 | * | 1/2004 | Nishikawa | 313/504 |
| 2004/0021413 | A1 | * | 2/2004 | Ito et al. | 313/504 |
| 2005/0185016 | A1 | * | 8/2005 | Mori et al. | 347/33 |
| 2008/0206673 | A1 | * | 8/2008 | Kawakami et al. | 430/275.1 |

* cited by examiner

*Primary Examiner*—Sikha Roy
*Assistant Examiner*—Jose M Diaz
(74) *Attorney, Agent, or Firm*—Squire, Sanders & Dempsey L.L.P.

(57) ABSTRACT

An organic electroluminescent element including a substrate, a first electrode, a partition wall next to the first electrode, an organic luminescent medium layer including an organic luminescent layer on the first electrode and second electrode is provided. The organic luminescent medium layer can be between the first electrode and the second electrode. An area where the organic luminescent medium layer is between the first electrode and the second electrode is a light emitting area. At least one layer among the organic luminescent medium layer is continuously formed from the light emitting area to a top face of the partition wall.

9 Claims, 13 Drawing Sheets

Prior art

Prior art

ORGANIC ELECTROLUMINESCENT ELEMENT COMPRISING A LUMINESCENT ASSIST LAYER

CROSS REFERENCE

This application claims priority to Japanese application number 2005-304091, filed on Oct. 19, 2005, which is incorporated by reference.

BACKGROUND OF THE INVENTION

1. Field of the Invention

The present invention is related to an organic electroluminescent element such as for information display terminals.

2. Description of the Related Art

An organic electroluminescent element has an organic luminous layer comprising organic luminescent material between two opposing electrodes. By means of applying electric current to the organic luminous layer between both electrodes, the organic luminous layer emits light. Organic luminescent layer thickness is important so that the organic luminous layer emits light efficiently. Organic luminescent layer thickness has to be about 100 nm. Even more particularly, for example, it is necessary to form a pattern of R (red), G (green), and B (blue) with high accuracy to make this a display panel.

Low molecular materials and polymeric materials are examples of organic luminescent materials that can be used to form the organic luminous layer. Generally, as for low molecular materials, thin film can be formed by vacuum evaporation. A mask with minute patterns is used at this time, and patterns are formed. In a manufacturing method with the use of vacuum processing such as vacuum evaporation, upsizing of a substrate can diminish the accuracy of the patterning.

Thus the following method has been tried recently. Polymer organic luminescent material is dissolved in a solvent, and ink is made. This ink is used, and thin film is formed by a wet coating method. As wet coating methods to form thin film, spin coating method, bar coat method, extrusion coat method and dip coat method are exemplified.

It is difficult to form high minute pattern by a wet coating. In addition, it is difficult to paint so that three colors of the pattern of RGB are separated.

As for the formation method of thin film by a printing method, a separated pattern is formed more easily. Therefore, formation method of thin film by a printing method is more effective.

Among various printing methods, ink jet process (Japanese Patent Laid-Open No. 10-12377 Official Gazette), offset printing (Japanese Patent Laid-Open No. 2001-93668 Official Gazette) and relief printing (Japanese Patent Laid-Open No. 2001-155858 Official Gazette) are proposed.

Most of an organic electroluminescent element comprising plural picture elements includes a substrate and a pattern shaped first electrode. A partition wall is formed between the pattern shaped first electrodes.

The two main purposes of forming a partition wall are described below.

The first purpose is described below. Because a partition wall covers a burr of an edge of a pattern-formed first electrode, a short circuit between a first electrode and a second electrode is prevented. A generation process of burr is explained below. A conductive film for a first electrode is formed on the entire surface of substrate. Thereafter, patterning of a photosensitive material is performed by photo-lithography method. Then the necessary part of a conductive film is masked. Then subsequently a first electrode is formed by etching of an exposed conductive film. In this case, a part (burr) of which unevenness is larger than that of a normal part can be generated at an edge of a pattern-formed first electrode. When an edge of a first electrode has a burr, even if an organic luminescent medium layer including an organic luminescent layer is formed on a first electrode, an organic luminescent medium layer cannot coat the projection part. Therefore when an organic electroluminescent element was made by forming a second electrode on the organic luminescent medium layer, short-circuit between a first electrode and a second electrode occurs. Therefore, an edge of a first electrode is covered by a partition wall.

The second purpose is described below.

Organic luminescent layers including organic luminescent materials which can emit lights of different colors are respectively formed in adjacent light emitting areas. A partition wall is formed to prevent color mixture in this case. When organic luminescent inks of organic luminescent materials which can emit lights of colors such as red, green and blue are dissolved in solvent are used, and organic luminescent layers are formed by printing methods, the concentrations of organic luminescent materials are several percent at most. The concentration of organic luminescent material is usually around 1%, and organic luminescent ink is low in viscosity. When a partition wall is not formed on substrate, ink spreads around a first electrode without ink staying only on a first electrode. Therefore, an organic luminescent ink overflows to an adjacent pixel (a light emitting area). Therefore, color mixture of organic luminescent layers occurs. Thus, it is necessary to form a partition wall between different luminescent color picture elements to prevent color mixture by infiltration of organic luminescent ink to adjacent pixel.

A cross-sectional drawing of a conventional organic electroluminescent element is shown in FIG. 1A. In addition, FIG. 1B is extended figure of the vicinity of a partition wall shown in FIG. 1A. Hole transport layer 3 is formed on first electrode 2 on substrate 1. Red (R) organic luminescent layer 41, green (G) organic luminescent layer 42 and blue (B) organic luminescent layer 43 is formed on hole transport layer 3 respectively. And second electrode 5 is formed on an organic luminescent layer (41, 42 and 43). Light emitting area L is a region sectioned by partition wall 7.

When an organic luminescent layer is formed on a substrate with a partition wall by organic luminescent ink, organic luminescent layer thickness near a partition wall tends to be thick as shown in FIG. 1B. When thick organic luminescent layer is formed in light emitting area L, and thickness of an organic luminescent layer fluctuates in a picture element, luminescent unevenness in a picture element of an organic electroluminescent element occurs.

In addition, an organic luminescent medium layer may include plural functional layers. Among these functional layers, there is a layer which can be formed by the same material for all picture elements. As such a layer, a hole transport layer is exemplified. About a hole transport layer, it is not necessary to perform picture element-shaped patterning. Hole transport material ink is applied by coating methods such as a spin coat method. In this way a hole transport layer is formed on a whole area of a substrate. In this case a similar problem occurs. In other words ink is applied to whole area of substrate to coat all picture elements (a light emitting area). In this case, the ink layer tends to be thick near a partition wall. Thickness of a hole transport layer fluctuates in a picture element. Therefore, luminescent unevenness in a picture element occurs.

In addition, when an organic electroluminescent element comprising plural picture elements is manufactured, organic luminescent inks which emit lights of different colors respectively are applied to plural adjacent picture elements. For this case, non-predetermined organic luminescent ink overflows to adjacent pixel. In other words color mixture occurs. To solve this problem, ink-repellent material is usually added in a partition wall. However, ink-repellent material bleeds from a partition wall to a light emitting area (a picture element) when ink-repellent material is used. An organic luminescent layer and a hole transport layer may not be formed partially in a light emitting area due to this phenomenon.

In these drawings, 1 is a substrate; 2 is a first electrode; 3 is a hole transport layer; 41 is a red (R) organic luminescent layer; 42 is a green (G) organic luminescent layer; 43 is a blue (B) organic luminescent layer; 5 is a second electrode; 6 is an organic luminescent medium layer; 7, 7x and 7y each are a partition wall; 8 is an adhesive: 9 is a sealing medium; 111 is a support medium; 112 is an active layer; 113 is a gate insulator; 114 is a gate electrode; 115 is an interlayer dielectric; 116 is a drain electrode; 117 is a planarizing layer; 118 is a contact hole; 119 is a data line; 120 is a thin film transistor; 10 is an ink tank; 12 is an ink chamber; 14 is an anilox roll; 14a is ink; 16 is a relief printing plate; 18 is a printing cylinder; 20 is a stage; 24 is a substrate; L is a light emitting area; N is a non-light emitting area; S1 is an overlapping width of a partition wall and an organic luminescent layer; and S2 is a overlapping width of partition wall and a hole transport layer.

SUMMARY OF THE INVENTION

In one embodiment, an organic electroluminescent element is provided including a substrate, first electrodes, partition walls between the first electrodes, organic luminescent medium layers including organic luminescent layers on the first electrode and second electrode(s), wherein the organic luminescent medium layer is sandwiched between the first electrode and the second electrode, wherein an area where the organic luminescent medium layer is sandwiched between the first electrode and the second electrode is a light emitting area, and wherein at least one layer among the organic luminescent medium layer is continuously formed from the light emitting area to a top face of the partition wall.

According to embodiments of the present invention, an organic electroluminescent element of which luminescent unevenness in a picture element due to unevenness of thickness of an organic luminescent medium layer near a partition wall is hard to occur is provided.

DESCRIPTION OF THE PREFERRED EMBODIMENTS

An organic electroluminescent element of the present invention is explained.

Figure 2A:
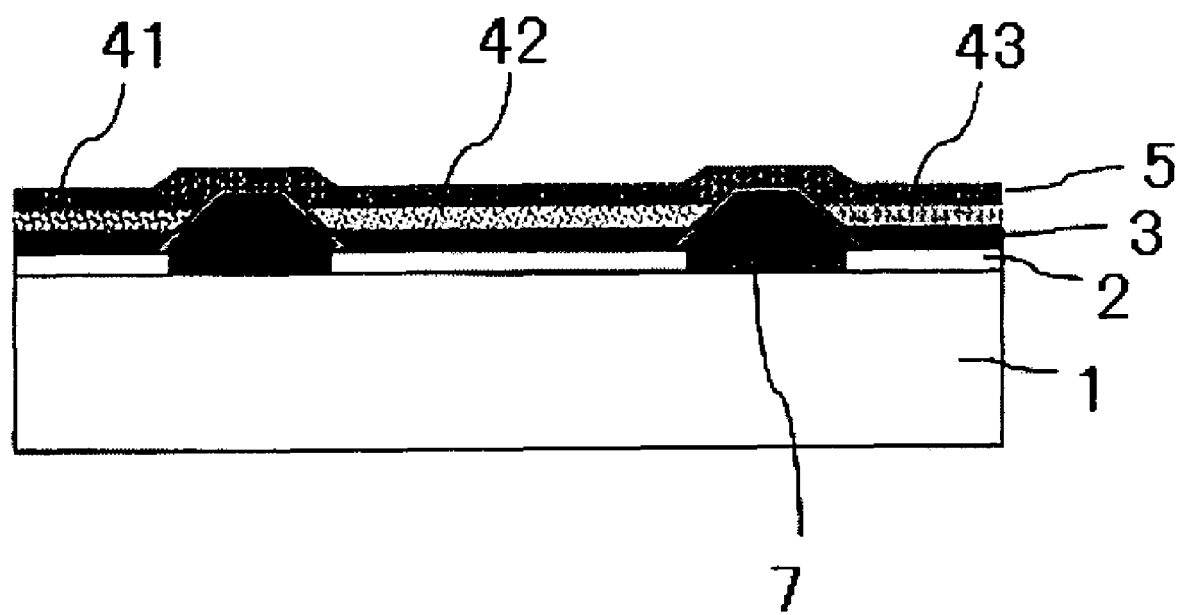
FIGS. 2A and 2B are cross-sectional views of an organic electroluminescent element of an embodiment of the present invention.
Figure 2B:
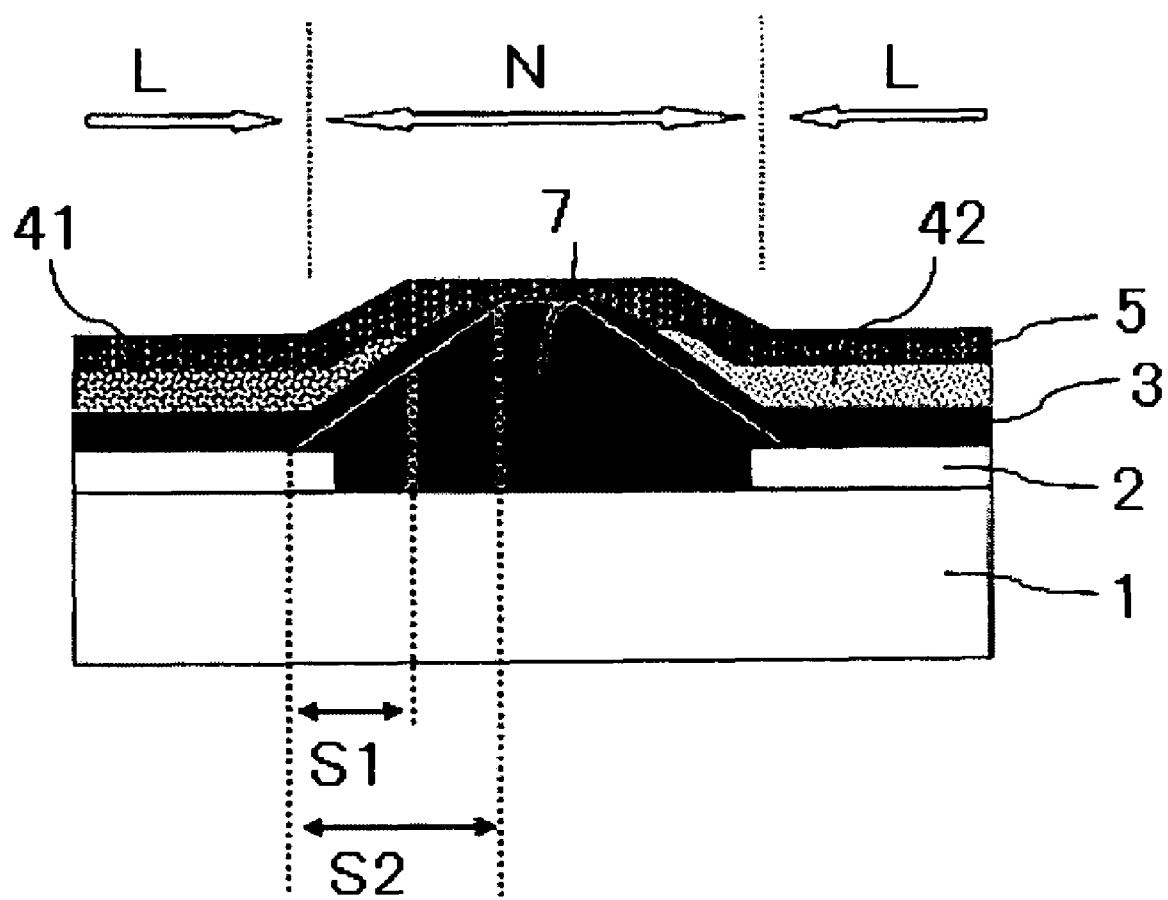

A sectional drawing of an organic electroluminescent element of an embodiment of the present invention is shown in FIG. 2A. In addition, FIG. 2B is extended figure of a partition wall part of FIG. 2A. For driving type of an organic electroluminescent element, passive matrix type and active matrix type are exemplified. An organic electroluminescent element of the present invention can be applied to both organic electroluminescent element of a passive matrix type and an organic electroluminescent element of an active matrix type.

An organic electroluminescent element of a passive matrix type is an organic electroluminescent element which includes stripe-shaped electrodes that are opposed to with perpendicular state. It emits light in the intersection point. On the other hand, an active matrix type has so-called thin film transistor (TFT) substrate. Transistor is formed in each pixel. In active matrix type, light is emitted in each pixel independently.

As shown in FIG. 2, an organic electroluminescent element of the present invention has a stripe shaped first electrode 2 as an anode on a substrate 1. Partition walls are formed between first electrodes. It is desirable that partition walls cover first electrode ends for the purpose of preventing a short circuit due to a burr of a first electrode edge.

Figure 3A:
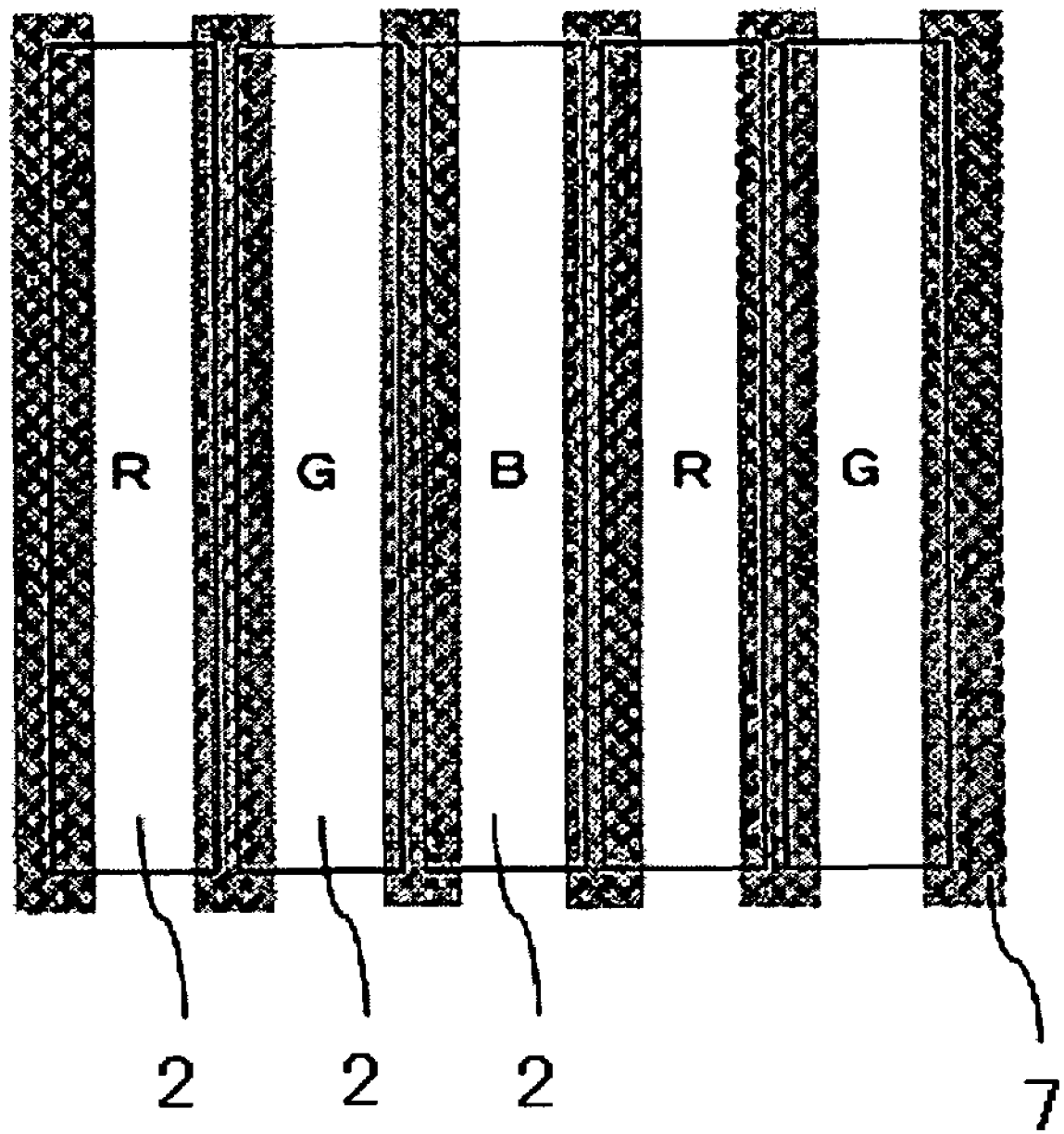
FIGS. 3A and 3B are layout drawings of a first electrode and a partition wall.
Figure 3B:
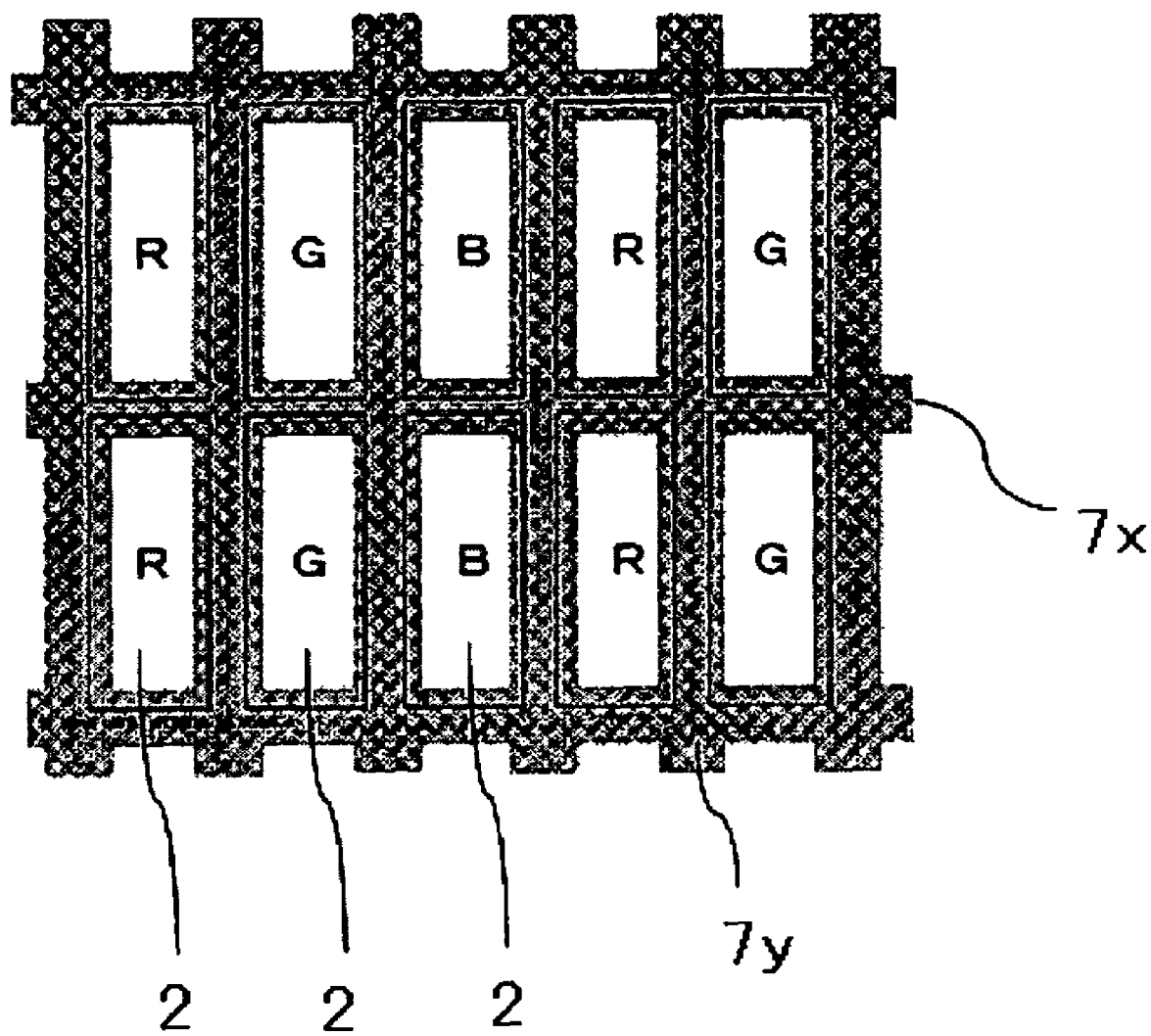
Figure 4A:
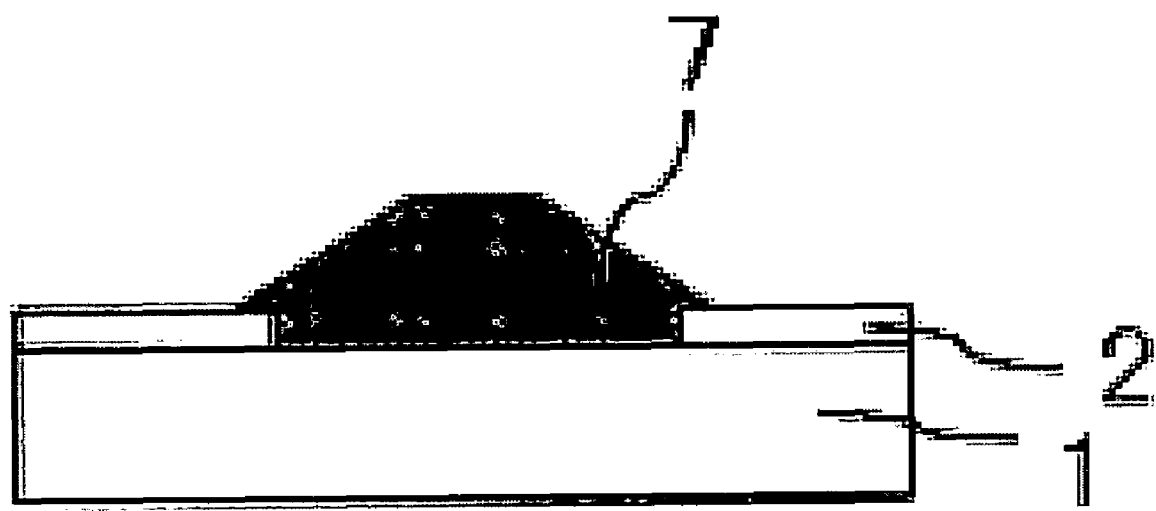
FIGS. 4A, 4B, 4C and 4D are sectional schematic views of partition walls of different embodiments of the present invention.
Figure 4B:
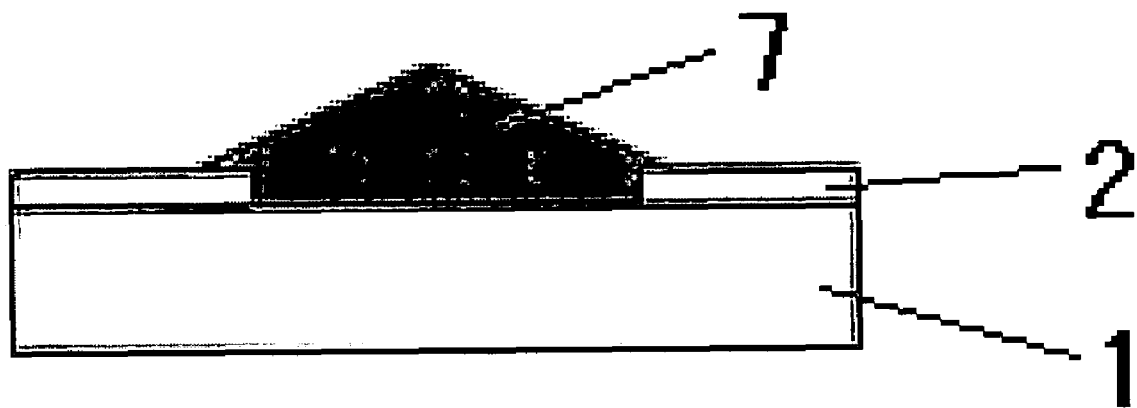
Figure 4C:
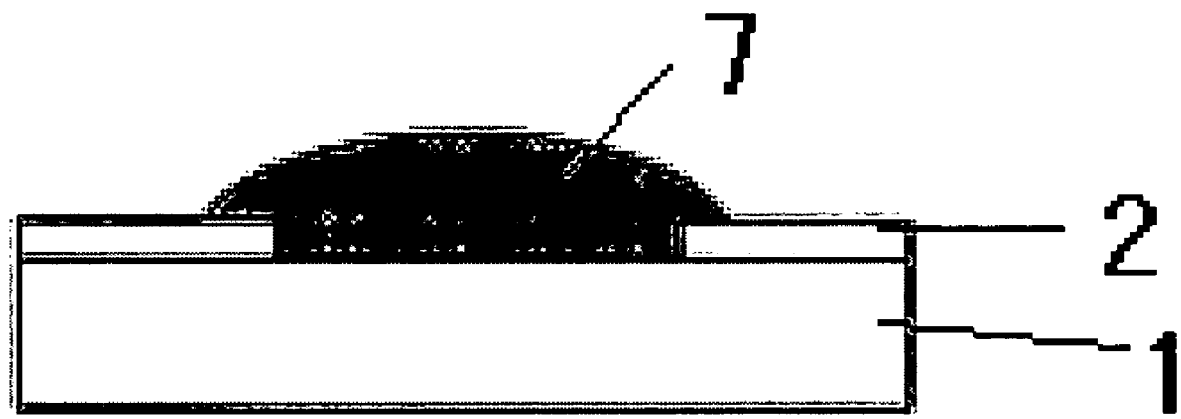
Figure 4D:
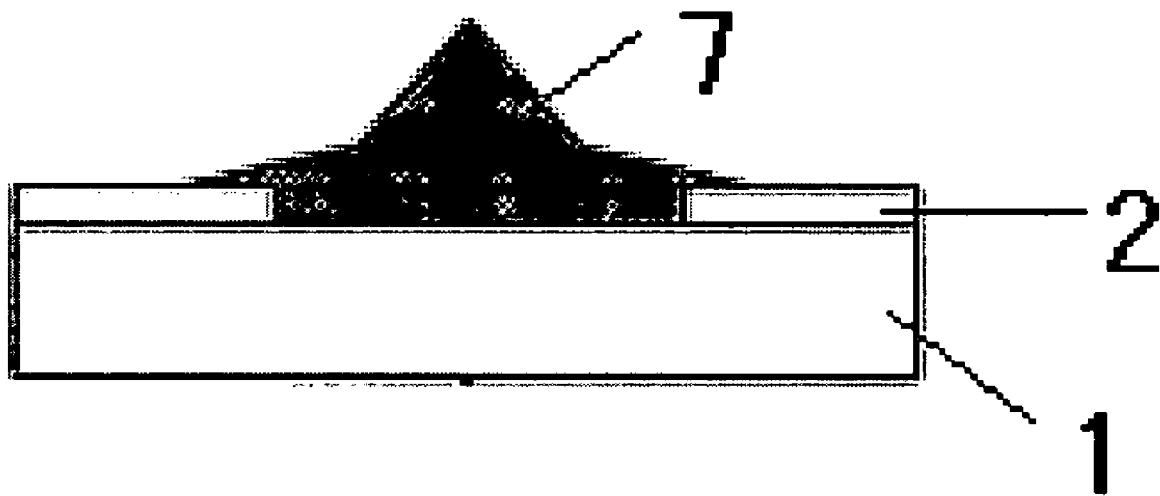

Layout drawing of first electrodes and partition walls is shown in FIG. 3. In addition, luminescent color pattern (red (R), green (G) and blue (B)) formed on each first electrode is shown. In the case of a passive matrix method, this first electrode 2 is stripe shaped.

Stripe shaped partition wall 7 is formed to cover first electrode edges. In the case of an active matrix method, first electrode 2 is formed in each picture element. A lattice shaped partition wall (7x, 7y) covers first electrode edges.

And an organic electroluminescent element of the present invention can have an organic luminescent medium layer. An organic luminescent medium layer can be formed in domain (light emitting area L, a picture element part) sectioned by partition wall 7 on first electrode 2. When an organic luminescent medium layer has only an organic luminescent layer, an organic luminescent medium layer is a monolayer structure. When an organic luminescent medium layer has an organic luminescent layer and a luminescent assist layer, an organic luminescent medium layer is a multi-layered structure. An organic luminescent layer includes organic luminescent material. An organic luminescent layer is a layer emitting light by application of an electric current. A luminescent assist layer assists movement of an electron and a hole to an organic luminescent layer. In other words a luminescent assist layer is a layer which assists and develops a luminescent function. As a luminescent assist layer, a hole transport layer, a hole injection layer, an electron transport layer and an electron injection layer are exemplified. In FIG. 2, an organic electroluminescent element having an organic luminescent medium layer which is a laminate with a luminescent assist layer (hole transport layer 3) and organic luminescent layers (41, 42, 43) is shown. Hole transport layer 3 is formed on first electrode 2. Red (R) organic luminescent layer 41, green (G) organic luminescent layer 42 and blue (B) organic luminescent layer 43 is formed on hole transport layer 3 respectively.

In an embodiment of the present invention, an organic luminescent medium layer can be formed continuously in area from light emitting area L to a top face of a partition wall. Here, a top face of a partition wall means an upper section of a part where width of a partition wall is the largest. FIG. 4 is sectional drawing showing examples of configuration of the partition wall which can be preferably used for an organic electroluminescent element of the present invention. In all examples of a partition wall shown here, a part where width is largest is a bottom face of a partition wall. Therefore, all exposed parts are top faces of a partition wall. In FIG. 2, width of the part where hole transport layer 3 overlaps with partition wall 7 is referred to as S2. In addition, width of the part where an organic luminescent layer (41) overlaps with a partition wall is referred to as S1. Film thickness of an organic luminescent medium layer changes significantly at the vicinity of a partition wall. When an organic luminescent medium layer is formed continuously to a top face of a partition wall, the part where change of film thickness of this organic luminescent medium layer is big is on a top face of a partition wall. Therefore, this part corresponds to non-light emitting area N. Therefore, a part where film thickness of the organic luminescent medium layer is uniform corresponds to light emitting area L. Thus, an organic electroluminescent element of which luminescent unevenness is small can be obtained.

It is preferable for an edge of a partition wall to be taper shape. When an edge of a partition wall is taper shape, ink is applied to a light emitting area sectioned by a partition wall on substrate, and ink spreads there. Therefore, an organic luminescent medium layer can be formed continuously from a light emitting area to a top face of a partition wall. Taper shape is the structure that height gradually increases from an edge of a partition wall towards central part of a partition wall. In addition, structure of the vicinity of center of a partition wall may be flat. In addition, structure of the vicinity of center of a partition wall may have a concave portion. For configuration of a partition wall, trapezoid, semicircle and the like are exemplified. A section schematic view of the partition wall which can be used for the present invention is shown in FIGS. 4A to 4D. In addition, configuration of the partition wall which can be used for the present invention is not limited to configuration of a partition wall shown in FIGS. 4A to 4D.

Preferably widths (S1, S2) of the parts where an organic luminescent layer or a luminescent assist layer included in the organic luminescent medium layer overlaps with a partition wall is more than 1 μm. When width of the overlap portion does not reach 1 μm, a part where change of film thickness of an organic luminescent medium layer near a partition wall is big corresponds to light emitting area L. Therefore, advantage offered by the invention is not obtained sufficiently. In addition, preferably width of the overlap portion is more than 3 μm.

In addition, the same organic luminescent layer or the same luminescent assist layer may be formed in adjacent pixels sectioned by a partition wall. In this case, these layers may be formed on a top face of a partition wall, and these layers in adjacent pixels may be connected to each other.

In addition, adjacent pixels sectioned by a partition wall may be different luminescent colors. In other words organic luminescent medium layers in adjacent pixels sectioned by a partition wall may be different. In this case, width (S1) of the part where a partition wall overlaps with an organic luminescent layer is preferably more than 1 μm. And width (S1) of the part where a partition wall overlaps with an organic luminescent layer preferably does not exceed width of a partition wall. When width of the overlap portion does not reach 1 μm, the part where change of film thickness of an organic luminescent layer near a partition wall is big corresponds to light emitting area L. Therefore, advantage offered by the invention is not obtained sufficiently. In addition, preferably width of the overlap portion is more than 3 μm. More preferably it is more than 10 μm.

In some embodiments, width (S1) of the part where an organic luminescent layer overlaps with a partition wall must not exceed width of a partition wall. The same color ink is applied to adjacent pixels for different luminescent colors. Then color mixture occurs.

In addition, in the present invention, different organic luminescent layers applied on adjacent pixels may overlap at a top face of a partition wall.

The upper limit of width of the part where an organic luminescent layer overlaps with a partition wall depends on slope of a top face of a partition wall. Preferably, width of the part where an organic luminescent layer overlaps with a partition wall is narrower than one-half of width of a partition wall to prevent color mixture with adjacent pixel.

Width of a partition wall formed between organic luminescent layers of different luminescent colors should be more than 20 μm to prevent color mixture between adjacent pixels. More preferably it should be more than 30 μm. When width of a partition wall is more than 20 μm, even if volume of applied ink is bigger than "regional volume", color mixture does not occur. This phenomenon is explained below in detail.

Ink supplied from ink feed body spreads between partition walls. However, before ink arrives at a light emitting area of adjacent other color by ink climbing over a partition wall, an organic luminescent layer dries. As used herein, the term "regional volume" means the volume obtained by multiplying height of a partition wall to area of a light emitting area. Even more particularly, when width of a partition wall is more than 30 μm, even if height of a partition wall is lower than 1 μm, color mixture can be prevented sufficiently. In addition, it is desirable that width of a partition wall is equal to or less than 100 μm not to narrow a light emitting area. When width of a partition wall exceeds 100 μm, proportion of a non-light emitting area formed by a partition wall becomes bigger. Therefore, an organic electroluminescent element of enough brightness is not obtained.

Even more particularly, preferably height of a partition wall is 0.1 μm-10 μm. More preferably, height of a partition wall is 0.5 μm-2 μm. When a partition wall is too high, formation of a second electrode and sealing are disturbed. When a partition wall is too low, edges of first electrodes cannot be completely covered or color mixture occurs.

Figure 7:
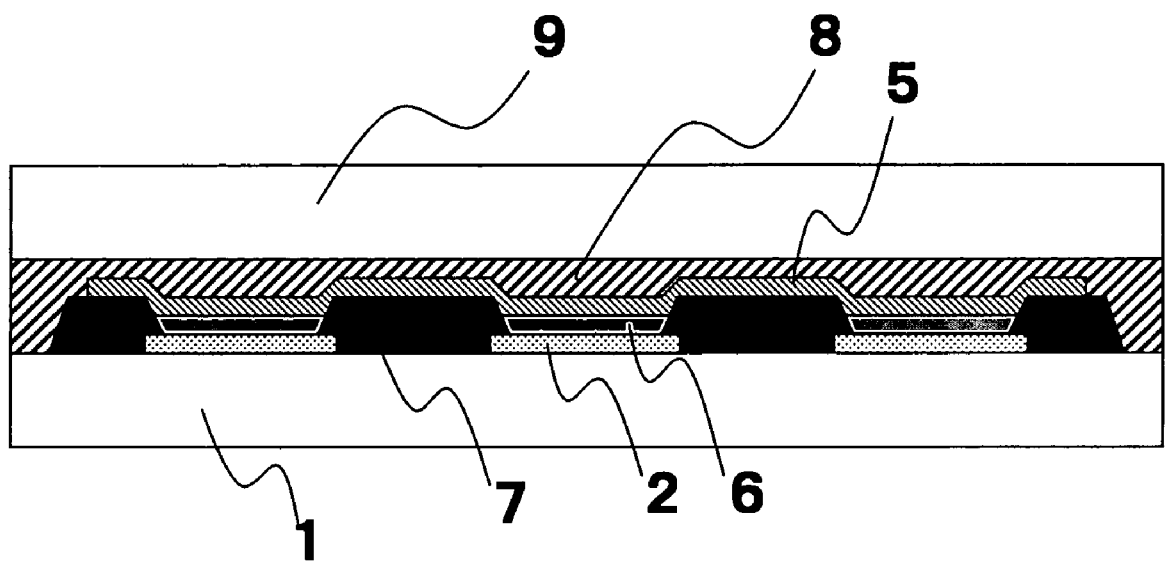
FIG. 7 is a sectional drawing when sealing medium is bonded to an organic electroluminescent element of the present invention.

Next second electrode 5 is formed to be facing with first electrode 2 on the organic luminescent medium layer. In the case of a passive matrix method, stripe shaped second electrodes are formed to be perpendicular to stripe shaped first electrodes. In the case of an active matrix method, a second electrode is formed on a whole area of an organic electroluminescent element. Preferably an organic electroluminescent element is further sealed to prevent infiltration of moisture, oxygen in surroundings to first electrodes, an organic luminescent medium layer including an organic luminescent layer and a second electrode. For example, sealing medium 9 such as glass plate or a metal plate is bonded to a whole area of an organic electroluminescent element with adhesive 8 to be able to coat an effective picture element (FIG. 7).

A manufacturing method of an organic electroluminescent element of the present invention is explained.

A substrate having insulating property can be used as a substrate. In the case of an organic electroluminescent element of bottom emission method, it is necessary to use a clear substrate.

By way of example only, a glass substrate and a quartz substrate can be used. In addition, a plastic film and sheet such as polypropylene, polyether sulfone, polycarbonate, cyclo olefin polymers, polyarylate, polyamide, polymethyl methacrylate, poly ethylene terephthalate and polyethylenenaphthalate can be used. Metallic oxide thin film, metal fluoride thin film, metal nitride thin film, metal oxynitriding membrane thin film or macromolecule resin film may be formed on a plastic film or sheet to prevent moisture from entering an organic luminescent medium layer. In addition, a substrate should be able to be insulated from a first electrode. For example, a metal plate which is subjected to an insulative processing can be used as a substrate.

In addition, it is preferable for a substrate to be heated beforehand. Moisture adsorbed in internal and surface of a substrate should be reduced by heating. In addition, depending on a material laminated on a substrate, surface of a substrate may be processed by processing such as ultrasonic cleaning processing, corona discharge treatment, plasma treatment and UV ozonization for improvement of adhesion.

Figure 5:
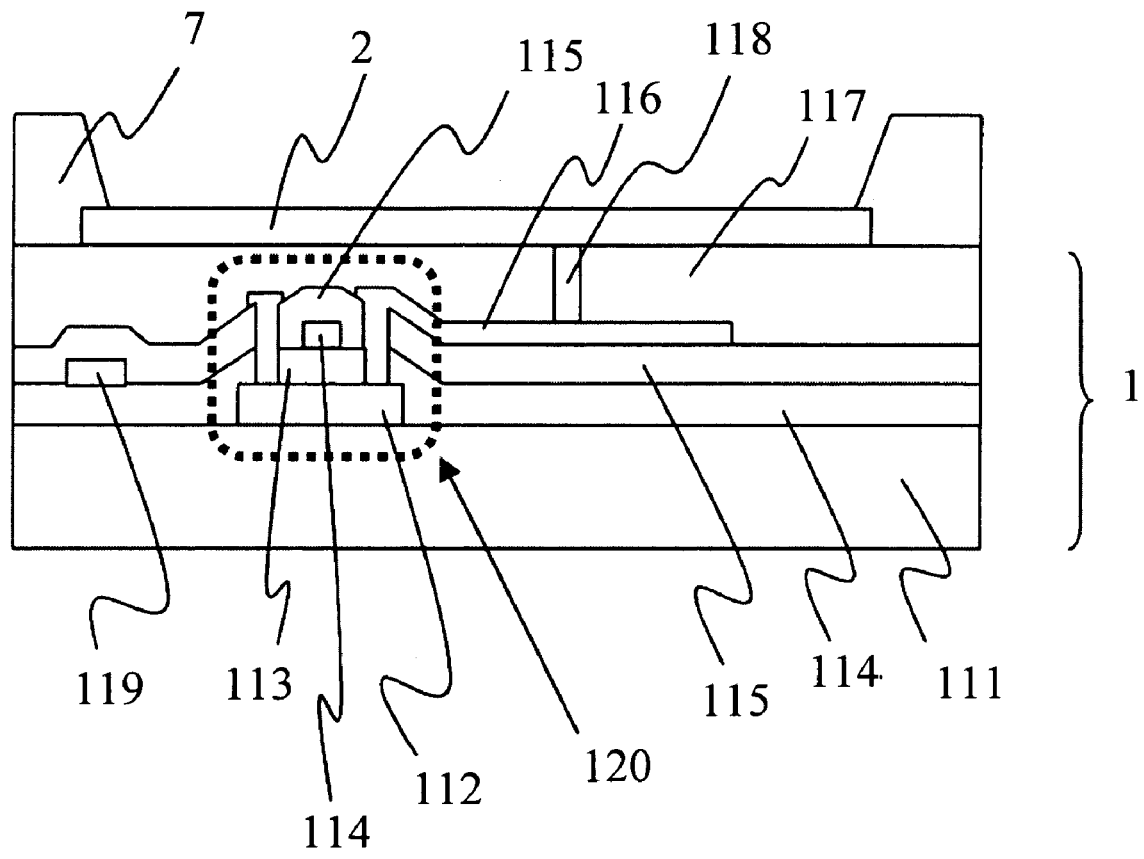
FIG. 5 is a sectional drawing of a substrate of an active matrix method of an embodiment of the present invention.

In addition, thin film transistor (TFT) is formed on a substrate, and a substrate for an organic electroluminescent element of active matrix method can be made. A cross-sectional example of a substrate of active matrix method of the present invention is shown in FIG. 5. On TFT 120, planarizing layer 117 is formed. A bottom electrode (the first electrode 2) of an organic electroluminescent element is formed on planarizing layer 117. Contact hole 118 is installed in planarizing layer 117. The bottom electrode is electrically connected to TFT by means of contact hole 118. Due to such a constitution, superior electrical insulating property can be achieved between TFT and an organic electroluminescent element. Insulating film between layers 115 is necessary. In FIG. 5, data line 119 is also illustrated.

TFT 120 and the upward organic electroluminescent element are supported with support medium 111. Support medium 111 should be superior in mechanical intensity and dimensional stability. Materials exemplified as materials for a substrate can be used as materials for support medium 111.

For thin film transistor 120 in a support medium, well-known thin film transistor can be used. Thin film transistor comprising the active layer that a source/drain region and a channel area are formed, the gate insulator and the gate electrode is exemplified. Configuration of thin film transistor is not limited especially. By way of example only, staggered type, reverse staggered type, top gate type and coplanar type can be used.

Active layer 112 is not limited especially. By way of example only, it can be formed by inorganic semiconductor material such as amorphia Si, polycrystalline silicon, crystallite Si, cadmium selenide or organic semiconductor material such as thiophene oligomer, poly (phenylene vinylene).

These active layers are made by the following methods:

1. A method to do ion doping after having laminated amorphous silicon by plasma CVD technique.

2. A method comprising the following process: Amorphous silicon is formed by LPCVD method using $SiH_4$ gas. By means of crystallization of amorphous silicon by solid phase epitaxy, a poly Si is obtained. Ion doping is done by ion implantation method.

3. A low temperature processing method comprising the following process:

Amorphous silicon is formed. By way of example only, $Si_2H_6$ gas is used, and amorphous silicon is formed by LPCVD method. Amorphous silicon is formed by PECVD method by means of $SiH_4$ gas. It is annealed by laser such as excimer lasers. A poly Si is obtained by crystallization of amorphous silicon. Ion doping is done by ion doping method.

4. A high temperature processing method comprising the following process: A poly Si is laminated by low pressure CVD method or LPCVD method. Thermal oxidation is done in more than 1,000 degrees Celsius, and gate insulator is formed. Thereupon, gate electrode 114 of an n+ poly Si is formed. Ion doping is done by ion implantation method.

For gate insulator 113, conventional gate insulator can be used. By way of example only, $SiO_2$ formed by PECVD method or LPCVD method and $SiO_2$ made by thermal oxidation of polysilicon film can be used.

For gate electrode 114, a conventional gate electrode can be used. By way of example only, metal such as aluminum, copper, refractory metal such as titanium, tantalum, tungsten, a poly Si, silicide of refractory metal and polycide can be used.

For configuration of thin film transistor 120, a single gate structure, a double gate structure, multiple gating configuration having gate electrodes more than 3 are exemplified. In addition, LDD configuration, offset configuration may be provided. Even more particularly, thin film transistors more than 2 may be placed all over one pixel.

It is necessary for a display unit of the present invention to be connected to so that thin film transistor functions as a switching element of an organic electroluminescent element. Drain electrode 116 of transistor is connected electrically with pixel electrodes (the first electrodes) of an organic electroluminescent element. In the case of top emission configuration, it is necessary for metal reflecting back light to be used as pixel electrodes.

Drain electrode 116 of thin film transistor 120 is connected with pixel electrodes (the first electrodes) of an organic electroluminescent element by a connection electric wiring. A connection electric wiring is formed in contact hole 118 penetrating through planarizing layer 117.

For a material of planarizing layer 117, inorganic materials such as $SiO_2$, spin-on-glass, SiN ($Si_3N_4$, TaO ($Ta_2O_5$) and organic materials such as polyimide resin, acrylic resin, photoresist material and black matrix material can be used. Spin coating, CVD and evaporation method can be selected depending on these materials. A photosensitive resin is used as a planarizing layer if necessary, and, by procedure of photolithography, contact hole 118 is formed. Or after having formed a planarizing layer on a whole area, contact hole 118 is formed by dry etching or wet etching in position corresponding to lower thin film transistor 120. Contact hole is buried by conductive material. And, the contact hole is connected with pixel electrodes on a planarizing layer. A planarizing layer should be able to cover up TFT, capacitor and electric wiring. Thickness of the planarizing layer should be several µm, and, by way of example only, it is about 3 µm.

The first electrode is formed on a substrate. When the first electrode is an anode, the following material can be used: metal complex oxide such as ITO (indium tin complex oxide), IZO (indium zinc complex oxide), stannic oxide, zinc oxide, indium oxide and zinc aluminium complex oxide; metallic substances such as gold, platinum and chromium; and a layer stack comprising these materials.

A formation method of the first electrode is explained below.

Dry method such as resistance heating evaporation method, electron-beam evaporation technique, reactivity evaporation method, ion plating method and sputtering method can be used depending on the material.

In addition, ITO is preferable for reasons of the follows: low electrical resistance, high solvent resistance, and transparentness (in the case of bottom emission method).

ITO is formed on a glass substrate by sputter method. The first electrode is formed by patterning of ITO by photolithography method.

After having formed a first electrode, partition wall is formed to cover first electrode edges. Partition walls have to have insulating property. By reason of the formation of partition wall, photosensitive materials can be used.

A positive type and negative type can be used as a photosensitive material. Light hardening resins such as photo radical polymerization system, photo cation cure corollary or copolymer containing acrylonitrile composition, poly vinylphenol, polyvinyl alcohol, novolac resin, polyimide resin and cyanoethyl pullulan can be used. In addition, as formation material of partition wall, $SiO_2$ and $TiO_2$ can be used.

When a formation material of a partition wall is a photosensitive material, solution of a formation material is coated by slit coat method or spin coating method entirely.

And patterning is performed by photolithography method including exposure process and development process. In the case of spin coating method, height of partition wall can be controlled under conditions of rotation number. However, only by one coating, height of partition wall is limited. If spin-coating process is repeated more than once, partition wall of height more than the limited height is able to be formed.

When a partition wall is formed by photolithography method using a photosensitive material, configuration of partition wall is controllable by exposure condition and development condition. Examples are described below.

A photosensitive resin of negative type is used. By exposure, development and post-bake, a partition wall is formed. Configuration of a partition wall end is taper configuration.

Development conditions such as a kind, density, temperature of a photographic developer or developing time should be controlled to form a partition wall.

When condition of development is mild, the following partition wall is formed: Configuration of a partition wall end is taper configuration.

On the contrary, when development condition is strong, the following partition wall is formed: Configuration of a partition wall end is inverse configuration of taper configuration.

In addition, when a formation material of a partition wall is $SiO_2$ or $TiO_2$, a partition wall can be formed by dry method such as sputtering method or chemical vapor deposition. For this case, patterning of a partition wall can be performed by a mask or photolithography method.

An organic luminescent medium layer is formed next.

An organic luminescent medium layer may be only one layer consisting of an organic luminescent layer. An organic luminescent medium layer may be plural layers consisting of an organic luminescent layer and a luminescent assist layer. A luminescent assist layer is a layer which helps an organic luminescent layer to emit light. As a luminescent assist layer, a hole transport layer, a hole injection layer, an electron transport layer and an electron injection layer are exemplified. In addition, a hole transport layer, a hole injection layer, an electron transport layer and an electron injection layer can be selected appropriately.

An organic luminous (luminescent) layer is the layer which emits light when electric current flows.

The following material can be used as an organic luminescent material of an organic luminous layer:

The following low molecular type luminescent material can be used:

9,10-diaryl anthracenes, pyrene, coronene, perylene, rubrene, 1,1,4,4-tetra phenylbutadiene, tris (8-hydroxyquinolonate) aluminium complex, tris (4-methyl-8-hydroxyquinolonate) aluminium complex, bis (8-hydroxyquinolonate) zinc complex, tris (4-methyl-5-trifluoromethyl-8-hydroxyquinolonate) aluminium complex, tris (4-methyl-5-cyano-8-hydroxyquinolonate) aluminium complex, bis (2-methyl-5-trifluoromethyl-8-quinolinolate) [4-(4-cyanophenyl) phenolate] aluminium complex, bis (2-methyl-5-cyano-8-quinolinolate) [4-(4-cyanophenyl) phenolate] aluminium complex, tris (8-quinolinolate) scandium complex, bis [8-(para-tosyl) aminoquinoline] zinc complex and cadmium complex, 1,2,3,4-tetraphenylcyclopentadiene and poly-2,5-diheptyloxi-para-phenylenevinylene.

In addition, the material which the following low molecular type luminescent material is scattered in a polymeric material can be used: coumarin corollary fluorescent substance, perylene corollary fluorescent substance, pyran type fluorescent substance, anthrone corollary fluorescent substance, porphyrin corollary fluorescent substance, quinacridon corollary fluorescent substance, N,N'-dialkyl displacement quinacridon corollary fluorescent substance, naphthalimido corollary fluorescent substance, N,N'-diaryl displacement pyrrolo pyrrole series fluorescent substance and phosphorescence fluor such as Ir chelate. Polystyrene, polymethyl methacrylate and polyvinylcarbazole can be used as a polymeric material.

In addition, the following macromolecule luminescent materials can be used: poly (2-decyloxy-1,4-phenylene) (DO-PPP), poly [2,5-bis-[2-(N,N,N-triethylammonium) ethoxy]-1,4-phenyl-alt-1,4-phenylene] a dibromide (PPP-NEt3+), poly [2-(2'-ethyl hexyloxy)-5-methoxy-1,4-phenylenevinylene] (MEH-PPV), poly [5-methoxy-(2-propanoxysulfide)-1,4-phenylenevinylene] (MPS-PPV), poly [2,5-bis-(Hexyloxy)-1,4-phenylene-(1-cyano vinylene)] (CN-PPV), a polyphenylene vinylene (PPV) derivative such as the above, poly (9,9-dioctyl fluorene) (PDAF) and polyspiro. Macromolecule precursor such as PPV precursor and PPP precursor can be used. In addition, existing luminescent material can be used.

Example of a hole transport material comprising a hole transport layer is described below:

copper phthalocyanine, metallophthalocyanine such as tetra(t-butyl) copper phthalocyanine, metal-free phthalocyanine, quinacridon chemical compound, aromatic amine type low molecular hole injection transportation material such as N,N'-di(1-naphthyl)-N,N'-diphenyl-1,1'-biphenyl-4,4'-diamine, 1,1-bis (4-di-p-tolylamino phenyl) cyclohexane, N,N'-diphenyl-N,N'-bis (3-methylphenyl)-1,1'-biphenyl-4, 4'-diamine, macromolecule hole transport materials such as polyaniline (PANI), polythiophene, polyvinylcarbazole, mixture with poly (3,4-ethylenedioxy thiophene) (PEDOT) and polystyrene sulfonate, polythiophene oligomer material and other existing hole transport materials.

As an electron transport material used for an electron transport layer, the following material is exemplified:

2-(4-Biphenyl-il)-5-(4-t-butylphenyl)-1,3,4-oxadiazole, 2,5-Bis (1-naphthyl)-1,3,4-oxadiazole, Oxadiazoles, Bis (10-hydroxybenzo [H] quinolinolate) beryllium complex, and triazole compound.

By means of dissolving an organic luminescent material with a solvent, an organic luminescent ink is made. As a solvent, toluene, dimethylbenzene, acetone, hexane, methyl ethyl ketone, methyl isobutyl ketone, cyclohexanone, methanol, ethanol, isopropyl alcohol, ethyl acetate, butyl acetate, 2-carbinyl-(t-butyl) benzene, 1,2,3,4-tetra methylbenzene, pentyl benzene, 1,3,5-triethylbenzene, cyclohexylbenzene and 1,3,5-tri-isopropyl benzene can be used.

The above described material may be used alone. In addition, the above described material is mixed, and it may be used.

Aromatic hydrocarbon is preferable.

In addition, detergent, antioxidant, viscosity modifier and UV absorber may be added in an organic luminescent ink if necessary.

For a solvent in which a hole transport material and an electron transport material dissolve, a toluene, xylene, acetone, methyl ethyl ketone, methyl isobutyl ketone, cyclohexanone, methanol, ethanol, isopropanol, ethyl acetate, butyl acetate, water and the like can be used.

These solvents may be used alone. Or these combined solvent may be used.

Water or alcohols are especially preferred to make a ink of a hole transport material.

An organic luminescent medium layer is formed by a wet method.

In addition, when the layer sandwiched between electrodes is a laminate, all of layers of the laminate are not necessary to be formed by a wet method.

For wet method, the following method can be used: application methods such as a spin coat method, a die coat method, a dip coat method, a discharge coat method, a precoat method, a roll coat method and a bar coat method, and printing methods such as relief printing, ink jet process, offset printing and photogravure process.

When a pattern-shaped organic luminescent layer of three colors of RGB is formed, it can be formed selectively on picture element regions by a printing method. Therefore, an organic electroluminescent element of full colors can be manufactured. The film thickness is lower than 1,000 nm whether the organic luminescent medium layer is monolayer or a laminate. Preferably it is 50 nm-150 nm.

An organic luminescent layer of the present invention is preferably formed by relief printing.

In an ink jet printing, ink is discharged towards a substrate from a discharge jet which is an ink feeding body. There is spacing between a discharge jet and a substrate. Ink discharged to a substrate is scattered by its bouncing at a substrate.

On the other hand, in relief printing, an ink transfers in the condition that a plate which is an ink supply body contacts a substrate. Therefore, an ink is not scattered. So a predetermined ink can be applied to a prescribed position.

For example, in methods such as relief printing, while ink is sandwiched between an ink feed body and a substrate, ink is supplied on a substrate. An organic luminescent layer is formed in this way. For this case, it is not necessary to consider scattering of an organic luminescent ink due to a bounce of an organic luminescent ink on a substrate. Spreading speed and drying speed of an organic luminescent ink after application of an organic luminescent ink to prescribed position are considered. Before an organic luminescent ink arrives at a light emitting area of a picture element of adjacent different luminescent color, an organic luminescent ink dries on a partition wall. Then color mixture of an organic luminescent layer can be prevented. Thus, height of a partition wall between picture elements of different luminescent colors may be low. In addition, configuration of an edge of a partition wall may be slow taper shaped. Thus, by spreading of organic luminescent ink to a top face of a partition wall, an organic luminescent layer can be easily formed to a top face of a partition wall continuously.

In this printing process, metal relief printing plate can be used, too. However, crack may occur in a substrate by pressing force in printing when a substrate is made of weak material such as glass. Therefore, it is desirable to utilize printing plate made of resin. A manufacturing method of printing plate made of such a resin is explained as follows. A layer of a photosensitive resin is laminated on a substrate of high dimensional stability such as polyester film. Subsequently a photosensitive resin is exposed through the mask that transmits light only in a printing area. Then printing areas are stiffened and unexposed non-hardening part is washed away with liquid developer such as a solvent. In this way photosensitive resin relief printing plate can be obtained.

An organic luminescent material of polymer system does not dissolve well in an organic solvent of a water system or alcohol system. In addition, there is harmful effect in the luminescent property when organic luminescent material of polymer system dissolves in an organic solvent of a water system or alcohol system. Therefore it is necessary to dissolve an organic luminescent material of polymer system in an organic solvent when an ink which is suitable for coating and printing is made. As this organic solvent, aromatic organic solvent such as toluene or dimethylbenzene is preferred. Thus, among functional inks, an organic luminescent ink is an ink including an aromatic organic solvent. Swelling of a relief printing plate by this organic solvent should be prevented. And it should be printed so that printing areas are precise. Therefore it is desirable to use a relief printing plate having resistance to an organic solvent.

It is preferable to use hydrophilic resin as a material of such a relief printing plate. Depending on development method, there are the following two kinds of photosensitive resins: the photosensitive resin which can be developed with water; and the photosensitive resin which can be developed with an organic solvent.

A photo-curing type photosensitive resin of water-developable type is applied to a substrate. And exposure/development are done. Water-developable plastic plate made in this way can be used. A water-developable photosensitive resin remains hydrophilic after it is hardened. Thus, swelling of the plastic plate due to oil solubility solvent in functional ink can be prevented.

As such a water-developable photo-curing type photosensitive resin, mixture of a hydrophilic polymer and polymer having unsaturated bonding can be exemplified. As hydrophilic polymer, polyamide, polyvinyl alcohol, and a cellulose derivative can be exemplified. In addition, as unsaturated bonding, vinyl bonding can be exemplified. As polymer having vinyl bonding, methacrylate system polymer can be exemplified. Photoresponsive initiator may be mixed in this water-developable photo-curing type photosensitive resin. Aromatic carbonyl compound can be used as photoresponsive initiator. Above all, a water-developable light-sensitive resin of polyamide system is desirable from an aspect of printability.

In addition, when a substrate is glass, it is preferable to use a soft plastic plate. On the other hand, when a substrate is various plastic sheets and plastic films, a printing plate except a plastic plate can be used. This is because plastic sheets and plastic films are hard to break.

Figure 6:
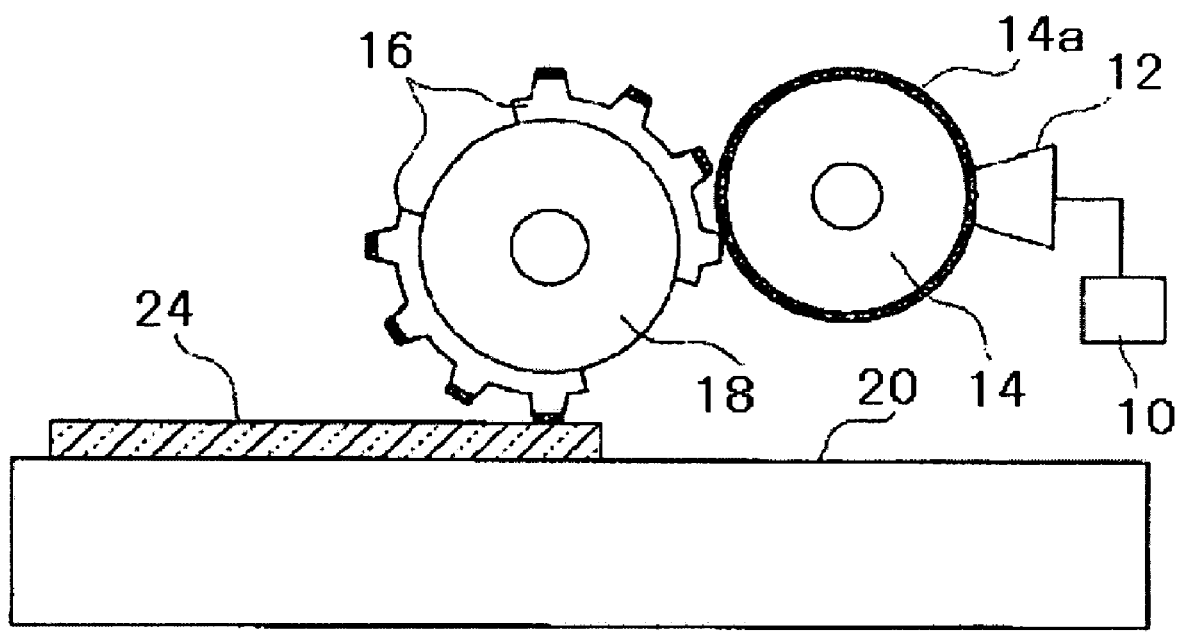
FIG. 6 is a schematic diagram of a relief printing apparatus which can be used for the present invention.

A schematic illustration of a relief printing device is shown in FIG. 6. This relief printing device prints organic luminescent ink on a substrate. This relief printing device has ink tank 10, ink chamber 12, anilox roll 14 and plate cylinder 18 on which plastic relief printing plate 16 is equipped. Organic luminescent ink is taken to ink tank 10. Organic luminescent ink is sent into ink chamber 12 from ink tank 10. Anilox roll 14 makes contact with ink feed section of ink chamber 12, and it is rotatably supported.

With rotation of anilox roll 14, ink layer supplied in anilox roll surface is formed with uniform thickness. The ink of this ink layer is transferred to a convex part of a plastic relief printing plate 16 rotationally driven in proximity to anilox roll 14. A substrate is transported to a printing position of a flat-bed printing machine by a transporting means that is not illustrated. And ink on a convex part of a plastic relief printing plate 16 is printed onto a substrate.

In this way organic electroluminescent element of color display can be formed.

Next, a second electrode is formed on an organic luminous medium layer.

When a second electrode is a cathode, the following material is used: the material that electron injection efficiency is high.

In some embodiments, metal such as Mg, Al and Yb can be used. In addition, the following second electrode may be used: thin layer such as Li or LiF of film thickness about 1 nm is provided on the surface of organic luminescent medium layer; and the metal membrane with high chemical stability is laminated on this thin layer. Al and Cu can be exemplified for such a metal having high stability.

In addition, the following material can be used as material of a second electrode to balance stability with electron injection efficiency: alloy with the metal having low work function and metals which are stable. For example, MgAg, AlLi, and CuLi can be used as such an alloy.

This second electrode can be formed by methods such as resistance heating evaporation method, electron beam method and sputtering method. It is desirable for thickness of a second electrode to be about 10-1000 nm. In the case of an organic electroluminescent element of so-called top emission type, a transparent material can be used for a second electrode.

By means of forming extremely thin membrane, a second electrode that transmits light is formed.

A second electrode can be formed selectively in area of a pixel of organic electroluminescent element. By way of example only, a second electrode can be formed in predetermined configuration by evaporating through a mask.

Because electric current flows to an organic luminous layer between electrodes, an organic electroluminescent element emits light. However, a part of an organic luminous layer, an organic luminous medium layer and a second electrode deteriorates by means of atmospheric moisture and oxygen. Thus a sealing medium is usually installed on an organic luminous layer to isolate an organic luminous layer from the outside.

A seal can be made as follows.

Sealing medium is bonded by adhesive to a substrate including a first electrode, an organic electroluminescent medium layer including an organic electroluminescent layer and a second electrode.

Sealing medium should have low moisture and oxygen transmissivity. The following material can be used as materials for sealing medium: ceramics such as alumina, silicon nitride and boron nitride; glass such as a no alkali glass and alkali glass; quartz; metallic foil comprising aluminium, stainless and the like; and a humidity resistance film.

Examples of a humidity resistance film include: a film which is formed of SiOx by CVD method on both sides of a plastic substrate; a laminated film of a film with low moisture and oxygen transmissivity; hydrophilic film; a film which water absorption agent was applied on the film with low moisture and oxygen transmissivity.

It is preferable for moisture or vapor transmission of a humidity resistance film to be less than $10^{-6}$ g/m²/day.

The following resin layer can be used as adhesive: Photo-curing type adhesive property resin; heat curing type adhesive property resin and 2 fluid hardening type adhesive property resin comprising epoxy system resin, acrylic resin, silicone oil and the like; acrylic resin such as ethylene ethylacrylate (EEA) polymer; vinyl resin such as ethylene vinyl acetate (EVA); thermoplastic resin such as polyamide and synthetic rubber; thermoplastic adherent resin such as acid denatured substances of polyethylene or polypropylene.

Sealing medium should be able to be bonded with enough intensity on a substrate on which electrodes and an organic luminescent medium layer is formed.

In addition, in the case of hardening of a resin layer, a resin layer which can prevent an organic luminescent medium layer suffering from a big influence (exposure of light/heat) should be used.

A method to form a resin layer on a sealing medium is described below.

Solvent solution method, "pushing out" laminate method, fusion/hot melt method, calendar method, nozzle application method, screen printing, vacuum laminate method and heated roll laminate method can be used.

Material having hygroscopicity and character absorbing oxygen can be incorporated into a resin layer if necessary.

Depending on size and configuration of an organic electroluminescent display unit to seal, thickness of a resin layer is decided. In some embodiments, it is desirable for thickness of a resin layer to be about 5-500 μm.

Under vacuum or dry inert gas, sealing medium can be pasted to a second electrode of an organic electroluminescent element.

When an organic electroluminescent element is sealed with a sealing medium and a resin layer of thermoplastic resin is used, only contact bonding by a heating roller should be performed.

When heat curing type adhesion resin is used as a resin layer, even more particularly, heating/hardening of a resin layer should be done in cure temperature after contact bonding by a heating roller.

When photo-curing type adhesion resin is used as a resin layer, even more particularly, a resin layer can be stiffened by an irradiation by light after contact bonding by roll.

Inorganic thin film such as silicon-nitride film of which thickness is 150 nm is layered on a second electrode directly by means of CVD method before a sealing medium is pasted to a second electrode.

In addition, a glass cap and a metal cap having a concavity are used, and an organic electroluminescent element can be sealed. A top face of a second electrode corresponds to the concavity. About the penumbra, the cap and the substrate are adhered.

In the present invention, an organic luminescent medium layer is formed continuously from a light emitting area to a top face of a partition wall. Therefore, the part where change of film thickness of an organic luminescent medium layer near a partition wall is big can be a non-light emitting area. Therefore, an organic electroluminescent element with little luminescent unevenness in a picture element can be obtained.

In addition, when width of the part where an organic luminescent medium layer overlaps with a partition wall is more than 1 μm, the above mentioned advantageous effect becomes remarkable. Therefore, an organic electroluminescent element with very little luminescent unevenness in a picture element can be obtained.

Width of the part where a partition wall between picture elements in which organic luminescent layers of different luminescent colors is formed overlaps with an organic luminescent layer is more than 1 µm. And width of this overlap portion does not exceed width of a partition wall. Then there is very little luminescent unevenness in a picture element. In addition, even if organic luminescent inks of different colors are applied to adjacent pixels, color mixture does not occur. In addition, because ink-repellent material is not used, an organic electroluminescent element without print omission can be obtained.

Example 1

ITO (an indium-tin oxide) thin film was formed on a glass substrate of 300 mm square by sputter method. Patterning of ITO film was performed by photolithography method and etching with the use of an acid solution. First electrode was formed in this way. The line width of line pattern of this first electrode was 120 µm. In addition, the space of line pattern of this first electrode was 40 µm.

A photosensitive material of a positive type was applied to a whole area of a significant surface by a spin coat method next. The film thickness of the photosensitive material was 1.2 µm. As the photosensitive material, the TELR series (a product made in TOKYO OHKA KOGYO CO.) was used. And partition walls were formed between first electrodes to cover first electrode edges after exposure/developing was performed. Width of the obtained partition walls was 80 µm, and height of the partition walls was 1.1 µm. In addition, as a result of having performed cross-sectional observation, a partition wall edge was trapezoid configuration shown in FIG. 2, and that a partition wall edge had taper shape was ensured.

The hole transport layer of which thickness was 0.1 µm was formed on first electrodes by a spin coat method with the use of ink. This ink is explained below. A mixture (PEDOT/PSS) of polypotomy (3,4-ethylenedioxy thiophen) and polystyrene sulfonate was dissolved in water. The concentration of PEDOT/PSS was 1 wt %.

Next, organic luminescent layers were formed with the use of red, green and blue organic luminescent inks. By relief printing with the use of a relief printing plate made of water-developable light-sensitive resin, each organic luminescent layer was formed. The organic luminescent inks (Red1100, Green1300 and Blue1100 (Sumitomo chemical co.)) were made by dissolving red, green and blue organic luminescent materials in a toluene respectively. The organic luminescent material was a poly fluorene system derivative. The concentration of organic luminescent material was 1 wt %.

In formation of an organic luminescent layer, an anilox roll of 150 line/inch was used. After formation of an organic luminescent layer, the organic luminescent layer was dried by a heating under vacuum. The film thickness of the obtained organic luminescent layer was 80 nm.

Thereupon, line-shaped second electrodes comprising Ca, Al was formed by resistance heating evaporation method using a mask to be perpendicular to line-shaped first electrodes. Finally an organic electroluminescent element was sealed using a glass cap and adhesive. Therefore, an organic electroluminescent element was protected from outside oxygen and moisture. An organic electroluminescent element was made in this way.

In a penumbra of an obtained organic electroluminescent element, there were taking-out electrodes of anode side and cathode side which were connected to each pixel electrodes. Condition of lighting display of a panel can be checked by connecting these taking-out electrode to a power source.

Example 2

An organic electroluminescent element which was approximately similar to example 1 was manufactured. But height of partition walls was 2.0 µm.

Example 3

An organic electroluminescent element which was approximately similar to example 1 was manufactured. But height of partition walls was 1.9 µm.

Example 4

An organic electroluminescent element which was approximately similar to example 1 was manufactured. But height of partition walls was 1.7 µm.

Example 5

An organic electroluminescent element which was approximately similar to example 1 was manufactured. But height of partition walls was 0.5 µm.

Comparative Example

Figure 1A:
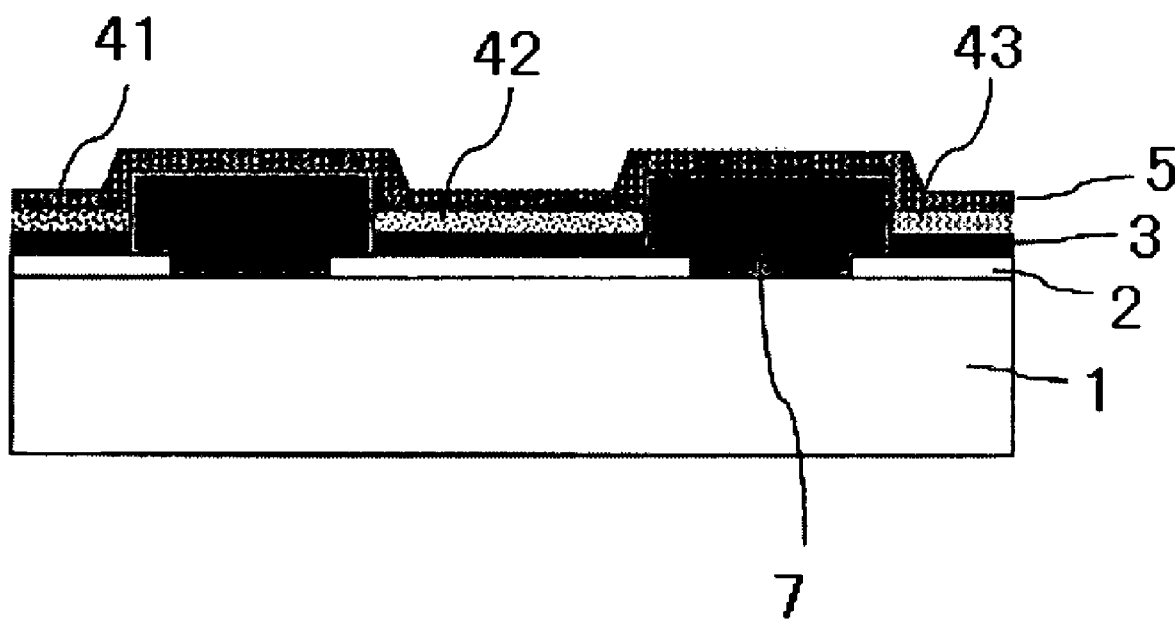
FIGS. 1A and 1B are cross-sectional views of a conventional organic electroluminescent element.
Figure 1B:
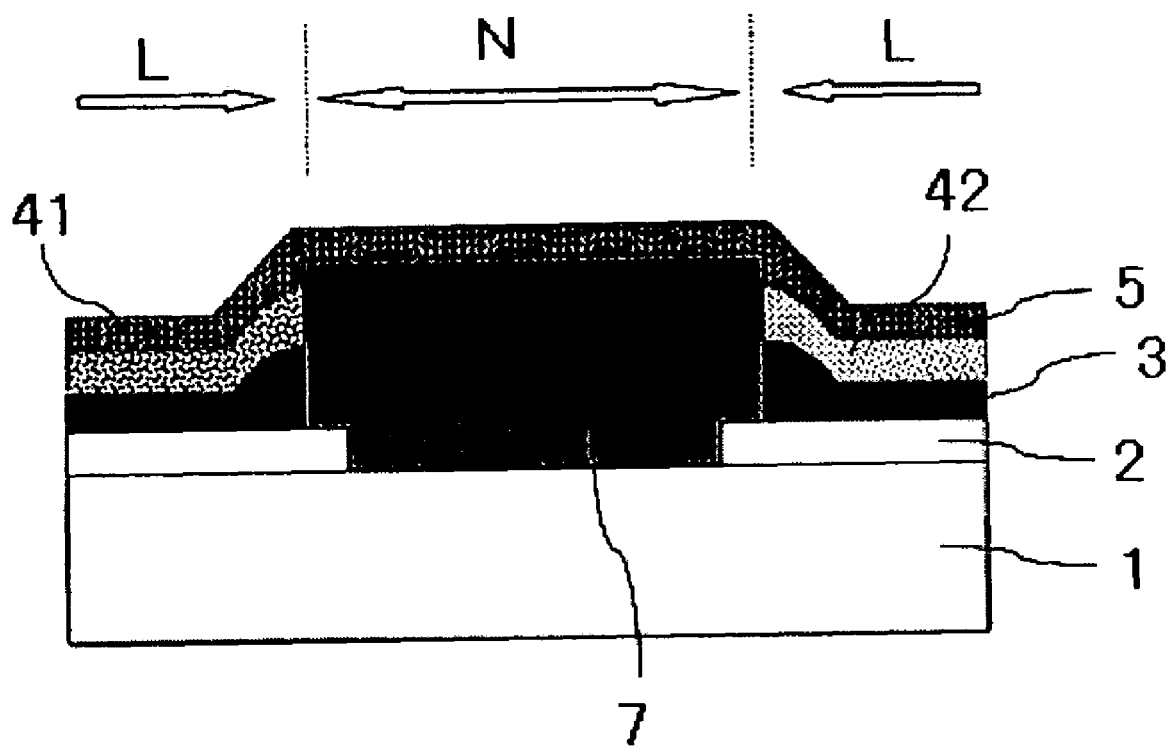

An organic electroluminescent element which was approximately similar to example 1 was manufactured. But height of partition walls was 1.5 µm. And the configuration of partition walls was rectangle shown in FIG. 1.

Section of the obtained organic electroluminescent element was observed. Width (S2) of the part where a partition wall overlapped with a hole transport layer was measured. Width (S1) of the part where a partition wall overlapped with an organic luminescent layer was measured. In addition, the obtained organic electroluminescent element was made to emit light. Existence or nonexistence of luminescent unevenness in a light emitting area (a picture element) was checked. The condition which a hole transport layer and an organic luminescent layer were repelled by a substrate and partition walls was checked. Result of a measurement and an estimation result were shown in Table 1.

TABLE 1

| | Configuration of a partition wall | Height of a partition wall | Width of Overlap between a partition wall and a hole transport layer | Width of Overlap between a partition wall and an organic electroluminescent layer | Estimation result of luminous unevenness |
| --- | --- | --- | --- | --- | --- |
| EXAMPLE 1 | Trapezoid (taper shape edge) | 1.1 µm | 14 µm | 9.0 µm | ◉ |

TABLE 1-continued

|  | Configuration of a partition wall | Height of a partition wall | Width of Overlap between a partition wall and a hole transport layer | Width of Overlap between a partition wall and an organic electroluminescent layer | Estimation result of luminous unevenness |
|---|---|---|---|---|---|
| EXAMPLE 2 | Trapezoid (taper shape edge) | 2.0 µm | 0.9 µm | 0.7 µm | Δ |
| EXAMPLE 3 | Trapezoid (taper shape edge) | 1.9 µm | 1.3 µm | 1.0 µm | ○ |
| EXAMPLE 4 | Trapezoid (taper shape edge) | 1.7 µm | 5.1 µm | 3.0 µm | ◎ |
| EXAMPLE 5 | Trapezoid (taper shape edge) | 0.5 µm | continuous | 38 µm | ◎ |
| Comparative Example | rectangle | 1.1 µm | 0.0 µm | 0.0 µm | X |

A mark of ◎ in a luminescent unevenness estimation result means that there was not luminescent unevenness. In addition, a mark of ○ means that minor luminescent unevenness was observed in a few picture element. A mark of Δ means that luminescent unevenness was observed in a part of light emitting area near a partition wall. Luminescent unevenness shown by a mark of ○ is less than that of a mark of Δ. In addition, a mark of an X means that luminescent unevenness was observed in a whole area near a partition wall surrounding a light emitting area.

In example 5, the luminescent unevenness was not observed. In addition, a hole transport layer was formed continuously on a whole area of the picture elements formed on a substrate. In other words the hole transport layer was formed over a top face of a partition wall.

In addition, in an organic electroluminescent element of all examples and comparative example, the hole transport layer and the organic luminescent layer were not repelled.

Luminescent unevenness of organic electroluminescent elements of example 1, 2, 3, 4 and 5 was less than that of comparative example. Therefore, in all examples, advantage offered by the invention was recognized.

In addition, the following fact was known from an estimation result of organic electroluminescent elements of example 1, 2, 3, 4 and 5. Preferably width of the part where an organic luminescent medium layer overlaps with a partition wall is more than 1 µm. More preferably it is more than 3 µm.

What is claimed is:

1. An organic electroluminescent element including a substrate, a first electrode, a partition wall next to the first electrode, an organic luminescent medium layer including at least one luminescent assist layer and organic luminescent layers on the first electrode, and a second electrode, wherein the organic luminescent layers emit different colors and are formed in adjacent pixels sectioned by the partition wall, wherein the organic luminescent medium layer is between the first electrode and the second electrode, wherein an area where the organic luminescent medium layer is between the first electrode and the second electrode is a light emitting area, wherein the luminescent assist layer is continuously formed from the light emitting area to a top face of the partition wall, wherein the organic luminescent layers are continuously formed from the light emitting area to the top face of the partition wall, and the organic luminescent layers overlap with the luminescent assist layer on the top face, and wherein a width of an overlapping portion of the organic luminescent layers over the top face of the partition wall is more than 1 µm and narrower than one-half of the partition wall.

2. The organic electroluminescent element according to claim 1, wherein a width of a part where the luminescent assist layer overlaps with the partition wall is more than 1 µm.

3. An organic electroluminescent element including a substrate, first electrodes, partition walls between the first electrodes, organic luminescent medium layers including luminescent assist layers and organic luminescent layers on the first electrodes, and second electrodes, wherein the organic luminescent layers emit different colors and are formed in adjacent pixels sectioned by the partition walls, wherein the organic luminescent medium layers are between the first electrodes and the second electrodes, wherein areas where the organic luminescent medium layers are between the first electrodes and the second electrodes are different color light emitting areas sectioned by the partition walls, wherein a width of a part where the organic luminescent medium layers overlaps with top faces of the partition walls sectioning different color light emitting areas is more than 1 µm and does not exceed the width of the partition walls, wherein the luminescent assist layers are continuously formed from the light emitting areas to the top faces of the partition walls, and wherein the organic luminescent layers are continuously formed from the light emitting areas to the top faces of the partition walls, and the organic luminescent layers overlap with the luminescent assist layers on the top faces, and a width of an overlapping portion of the organic luminescent layers over the top faces of the partition walls is narrower than one-half of the width of the partition walls.

4. A method for manufacturing an organic electroluminescent element including a substrate, first electrodes, partition walls next to the first electrodes, an organic luminescent medium layer including at least one luminescent assist layer and organic luminescent layers on the first electrodes, and second electrodes, wherein the organic luminescent layers emit different colors and are formed in adjacent pixels sectioned by the partition walls, wherein the organic luminescent medium layer is between the first electrodes and the second electrodes, wherein areas where the organic luminescent medium layer are between the first electrodes and the second electrodes are light emitting areas, and wherein the luminescent assist layer is continuously formed from the light emitting areas to the top faces of the partition walls and the method comprising:

forming a first organic luminescent layer on one of the first electrodes so that the first organic luminescent layer is formed from a light emitting area to top faces of the partition walls by applying a first color organic luminescent ink, and forming a second organic luminescent layer on another one of the first electrodes so that the second organic luminescent layer is formed from a light emitting area to top faces of the partition walls by applying a second color organic luminescent ink, wherein the organic luminescent layers overlap with the luminescent assist layer on the top faces of the partition walls, and wherein a width of an overlapping portion of the organic luminescent layers over the top faces of the partition walls is more than 1 µm and narrower than one-half of the width of the partition walls.

5. The method for manufacturing an organic electroluminescent element according to claim 4,
wherein forming the first and second organic luminescent layers is performed by relief printing.

6. The method for manufacturing an organic electroluminescent element according to claim 4,
wherein the luminescent assist layer includes a hole transport layer,
the method comprising:
forming the hole transport layer
and thereafter
forming the organic luminescent layer.

7. The method for manufacturing an organic electroluminescent element according to claim 4,
wherein the inks dries before the inks arrive at the light emitting area of adjacent other color.

8. The organic electroluminescent element according to claim 1, wherein the width of a part where the organic luminescent medium layer overlaps with the partition wall is more than 3 µm.

9. The organic electroluminescent element according to claim 3, wherein the width of a part where the organic luminescent medium layers overlap with the partition walls is more than 3 µm.

* * * * *